(12) United States Patent
Lin et al.

(10) Patent No.: US 6,757,702 B1
(45) Date of Patent: Jun. 29, 2004

(54) ADAPTIVE FILTER

(75) Inventors: Jinan Lin, Ottobrun (DE); Maximilian Erbar, Villingen-Schwenningen (DE)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/674,811

(22) PCT Filed: Apr. 28, 1999

(86) PCT No.: PCT/EP99/02877

§ 371 (c)(1),
(2), (4) Date: Apr. 16, 2001

(87) PCT Pub. No.: WO99/59245

PCT Pub. Date: Nov. 18, 1999

(30) Foreign Application Priority Data

May 9, 1998 (DE) .......................... 198 20 908

(51) Int. Cl.[7] ............................................. G06F 17/10
(52) U.S. Cl. ................................................... 708/322
(58) Field of Search ................................ 708/322, 323

(56) References Cited

U.S. PATENT DOCUMENTS

| 4,649,335 | A | | 3/1987 | Lassaux et al. |
| 5,894,495 | A | * | 4/1999 | Kase ............... 375/232 |
| 6,519,342 | B1 | * | 2/2003 | Opitz ............... 381/61 |

FOREIGN PATENT DOCUMENTS

| EP | 0146175 | 6/1985 | ............ G01R/31/11 |
| EP | 0543568 | 5/1993 | ............ H03H/21/00 |
| EP | 0813301 | 12/1997 | ............ H03H/21/00 |

OTHER PUBLICATIONS

S. Maginot et al, "A General Purpose High Speed Equalizer", Proceedings of the Custom Integrated Circuits Conference, Boston May 13–16, 1990, No. CONF. 12,pp. 2561–2564.
J.B. Evans et al, "A CMOS Implementation of a Variable Step Size Digital Adaptive Filter", Spectral Estimation, VLSI, Underwater Signal Processing, Glasgow, May 23–26, 1989, vol. 4, No. CONF. 14, Institute of Electrical and Electronics Engineers, pp. 2489–2492.
H.S. PUnjabi et al, "A Modified Mu–Weighted Normalized Frequency–Domain LMS Algorithm" Proceedings of the Global Telecommunications Conferencd San. Francisco, Nov. 28–Dec. 2, 1994, vol. 1, Institute of Electrical and Electronics Engineesisbn: 0–7803–1821–8, pp. 232–236.
Nicol, Chris J., et al. "A Low–Power 128–Tape Digital Adaptive Equalizer for Broadband Modems" in IEEE Journal of Solid–State Circuits, vol. 32, No. 11, Nov. 1997, S. 1777–1789.
Report from German Patent Office.

* cited by examiner

Primary Examiner—David H. Malzahn
(74) Attorney, Agent, or Firm—Joseph S. Tripoli; Joseph J. Laks; Ronald H. Kurdyla

(57) ABSTRACT

The invention relates to a method for calculating a least mean square algorithm using an N-tap filter. A modified least mean square algorithm is used for the calculation. In a first calculation step, calculation is effected using a first, wide bit width in the N taps. In a second step, depending on the result of the first calculation step, a second, smaller number of bits is selected for the further method steps.

5 Claims, 3 Drawing Sheets

ADAPTIVE FILTER

The invention relates to an adaptive filter.

PRIOR ART

Adaptive filtering can advantageously be used to restore digital signals subjected to interference, particularly if the interference is caused by crosstalk or by a transmission channel whose channel characteristics are unknown or affected by a timing error.

A simple adaptive filter algorithm is the known LMS algorithm, which requires 2N multipliers for an N stage filter structure. However, each of these multipliers must be sufficiently accurate to ensure the requisite stability. The known LMS algorithm can be realized by software or by a combination of software and hardware filter structures. In the case of a real-time hardware realization, however, there is the disadvantage of the high outlay on circuitry, which is too cost-intensive for some applications.

INVENTION

The invention is based on the object of specifying a hardware realization of an adaptive filter which has the requisite stability in conjunction with a reduction in the outlay on hardware.

According to the invention, an adaptive filter is realized by modification of the LMS algorithm. This saves a large part of the multipliers in such a way that the coefficient adaptation is suppressed and a coefficient register is preferably divided into two sub-areas, in order to reduce the bit width of the filter multipliers.

An adaptive filter is described mathematically by:

$$y(n) = \sum_{i=0}^{N-1} bi(n) * x(n-i).$$

When the adaptive filter according to the invention is used for lower frequency components, it is preferable to take only every second sample, according to:

$$y(n) = \sum_{i=0}^{N-1} b_i(n) * x(n-2*i)$$

where n=cycle index, x(n) and y(n) are the input and output samples, and $b_i(n), i=0,1, \ldots N-1$ are the filter coefficients of the cycle n.

The LMS algorithm for the adaptation of the coefficients is calculated according to:

$$b_i(n) = b_i(n-1) + \mu^* e(n-1)^* x(n-i-1), i=0,1,\ldots, N-1$$

where $$e(n) := d(n) - y(n)$$

where d(n) is the so-called desired output and m is the adaptation constant. It is evident that an LMS-adaptive filter requires two multipliers, one for the filtering and one for the coefficient adaptation, for each coefficient digit position, called tap below.

The adaptation $\mu^* e(n-1)^* x(n-i-1)$ should be small enough to guarantee the stability of the adaptation procedure, that is to say to obtain a sufficient accuracy of the coefficients $b_i(n), i=0,1 \ldots N-1$.

The inventive modification of LMS algorithm reads as follows:

$$b_i(n) = b_i(n-1) + e(n-1)^* x(n-i-1)^* 2^{-(k-12)}, i=0,1,2,\ldots,14,$$

where $$e(n) := \text{SIGN}(d(n) - y(n)),$$

and $$\text{SIGN}(\xi) := \begin{cases} -1, & \xi < 0 \\ 0 & \xi = 0 \\ 1 & \xi > 0 \end{cases}$$

and k=0,1,2,3 is the user option, which can be designated as the adaptation constant.

For each tap, only one multiplier for the filtering is used. The adaptation requires a register with a sufficient length of e.g. 18 bits in order to achieve the requisite accuracy for the stability of the adapted LMS algorithm.

In order further to reduce the outlay on hardware, only a number of MSBs, the coefficient bits, preferably 8 bits of the register, are taken as filter coefficients and used for the multiplication.

In a further refinement of the invention, the 8 bits of the register are fed to an evaluation circuit which, depending on the value of the 8 bits, performs windowing in order to achieve a further reduction to e.g. 5 bits. The evaluation circuit preferably eliminates leading equivalent bits by a shift function and clips a number of LSBs. This reduced value is used for the further calculation. The result of the evaluation circuit, preferably a 2-bit value, is used in a further, downstream shift function in order to recover the correct value.

The effect advantageously achieved by the inventive adaptation of the LMS algorithm is that only one multiplier is required for each tap register. It is advantageous that, by virtue of the separate utilization of the tap registers for the adaptation and the filter multiplications, only a small bit width is required for the multipliers, without the accuracy and the requisite stability for the adaptation process being impaired. The use of the window moving technique according to the invention achieves a further reduction in the necessary bit width for the multipliers. As a result, it is no longer necessary to take account of the dynamic range of the coefficient values when selecting the multiplier bit width.

DRAWINGS

Moreover, an exemplary embodiment of the adaptive filter according to the invention is described with reference to the drawings.

EXEMPLARY EMBODIMENTS

Figure 1:
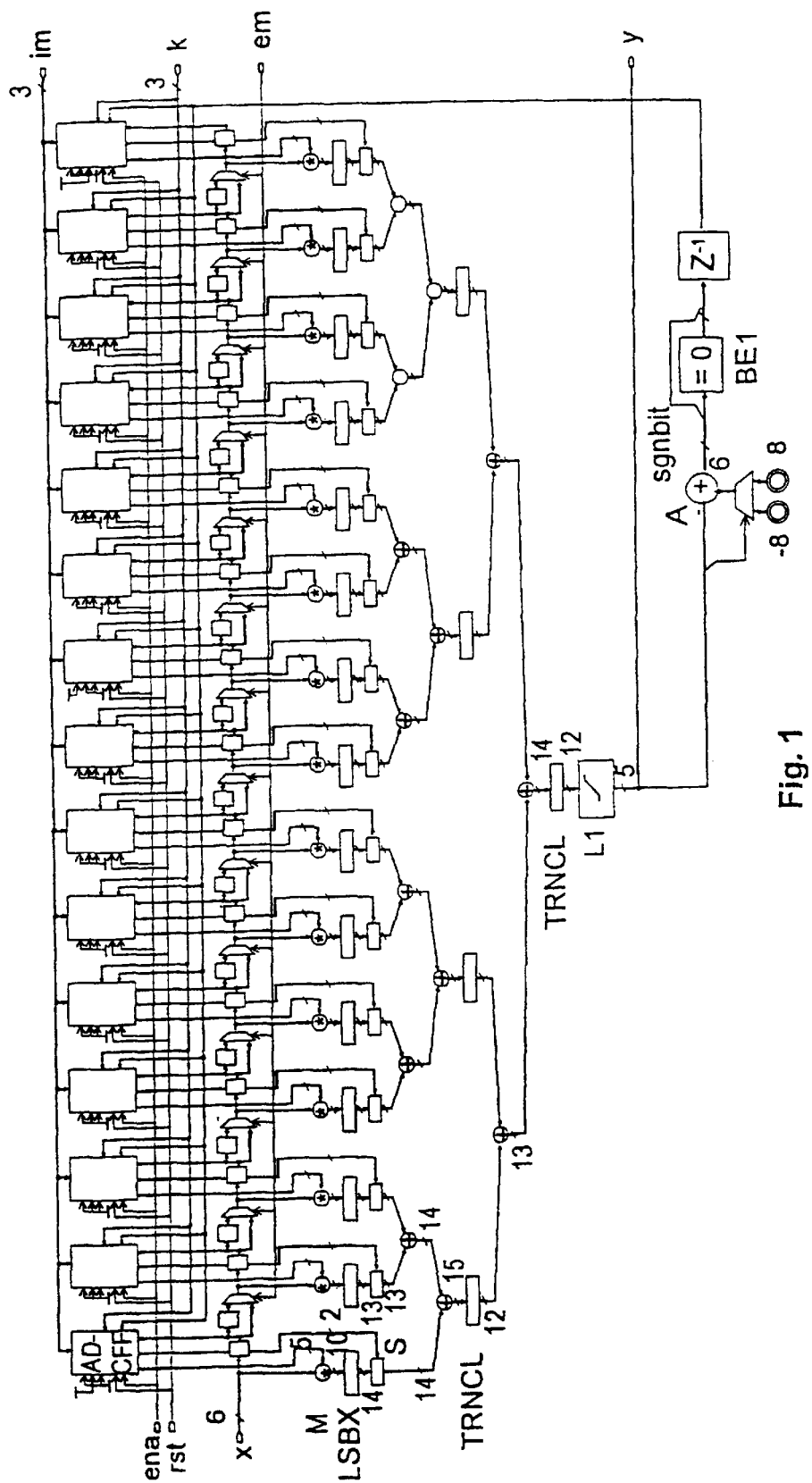
FIG. 1 shows an adaptive filter.
Figure 2:
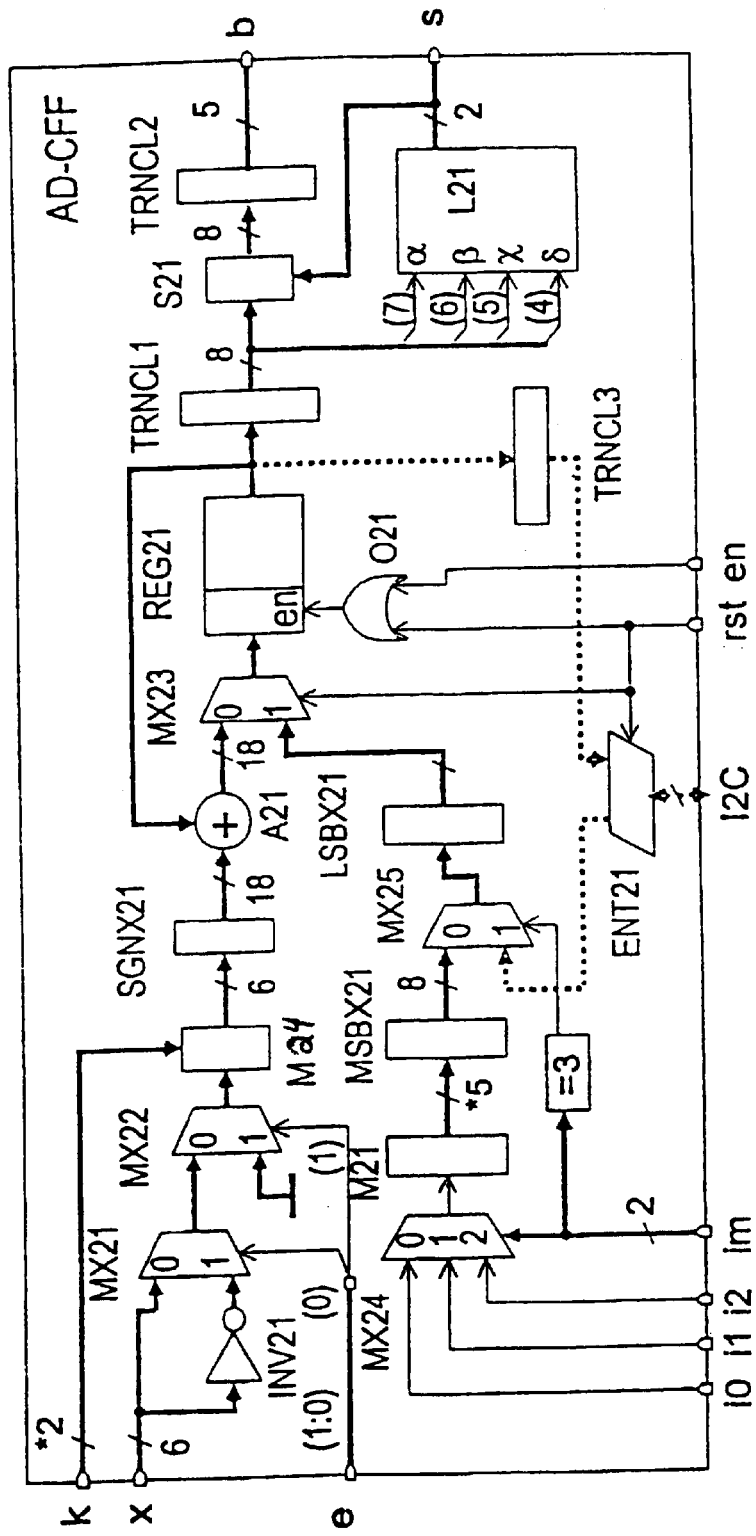
FIG. 2 shows a block for the coefficient adaptation.

FIG. 1 shows an exemplary embodiment of an adaptive filter containing 15 blocks AD-CEF for the coefficient adaptation of the kind illustrated in detail in FIG. 2. FIG. 2 shows a block for the coefficient adaptation AD-CEF having an input x, an output b and also an enable signal en, an input K for predetermined adaptation constants, an input im for an operating mode and an I2C input I2C for external driving. The input x is connected to a 0 input of a multiplexer MX21 via an inverter INV21. The output of the multiplexer MX21 is connected to a 0 input of a multiplexer MX22, the 1 input of which is connected to earth. Control lines of the two multiplexers MX21, MX22 are connected to the input e, the multiplexer MX21 being switched by bit 0 (LSB) and the multiplexer MX22 passes to an adder A21 via a multiplier M24, whose coefficient is set by the input k, and via a signed extension device SGNX21. The output of the adder A21 passes via the 0 input of a multiplexer MX23 to a register REG21, the output of which passes, on the one hand, back to a second input of the adder A21 and also to the output b via a device TRNCL1 for clipping less significant bits, a shift register S21 and a further device TRNCL2 for clipping less significant bits.

A multiplexer MX24 has applied to its inputs 0, 1, 2 coefficients i0, i1, i2 of an initialization mode for internal initialization, and to its control input a coefficient of an initialization mode for external initialization. The output of the multiplexer MX24 passes. to the 1 input of the multiplexer MX23 via a multiplier M21, an MSB extension device MSBX21, the 0 input of a multiplexer MX25 and an LSB extension device LSBX21. In the case where the coefficient assumes the value "3", a logic "1" is fed to the control input of the multiplexer MX25. The I2C input is connected to the 1 input of the multiplexer MX25 via a decision circuit ENT21. The output of the register REG21 passes to the 0 input of the decision circuit ENT21. Both a control input of the decision circuit ENT21, and of the multiplexer MX23, and, via an OR gate O21, an enable input en of the register REG21 are connected to the input rst. The input en passes to a second input of the OR gate O21.

The output of the device TRNCL1 for clipping less signigicant bits additionally passes to a logic circuit L21 having the inputs $\alpha$, $\beta$, $\chi$, $\delta$. Depending on which bits 7, 6, 5, or 4 are set, the inputs $\alpha$, $\beta$, $\chi$, $\delta$, are occupied and a corresponding output signal s is fed from the logic circuit L21 to a control input of the shift register S21, which fulfils the function $2^s$.

The algorithm for the coefficient adaptation can be calculated as follows:

$$b_i(n)=b_i(n-1)+e(n-1)*x(n-i-1)*2^{-k-11}, i=0,1,2,\ldots,14,$$

in which case $$e(n) := \begin{cases} SIGN(32 - y(n)), & y(n) \geq 0 \\ SIGN(-32 - y(n)), & y(n) < 0 \end{cases}$$

where $$SIGN(\xi) := \begin{cases} -1, & \xi < 0 \\ 0 & \xi = 0, \\ 1 & \xi > 0 \end{cases}$$

and k=0,1,2,3 is a user option, which can be designated as the adaptation constant.

In order to set up the algorithm, an 18 bit register REG21 is necessary for each tap, in order to store $b_i(n)$ bits. Such a register is called a tap register in this case. The 8 MSBs are designated as coefficient bits and used as filter coefficients, while the entire register REG21 serves as adaptation store. The 8 coefficient bits of each tap register REG21 can preferably be read or written by an external processor by means of an I2C bus.

Figure 4:
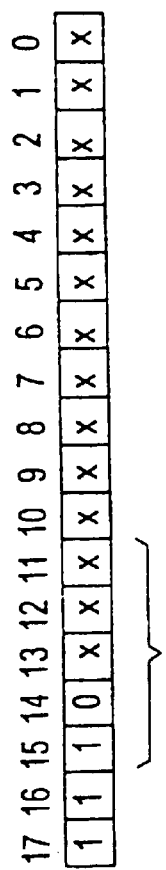
FIG. 4 shows window moving in a tap register.

However, only 5 of the 18 bits are used for the filter multiplications as are illustrated in FIG. 1. These 5 bits are selected by means of a variable window across the 8 bits of the register REG21. The shifting of the movable window, as is illustrated in FIG. 4, is calculated by the logic circuit L21 according to the following rule:

$$s = \begin{cases} 0, & \alpha \neq \beta, \\ 1, & (\alpha = \beta) \wedge (\beta \neq \chi), \\ 2, & (\alpha = \beta = \chi) \wedge (\chi \neq \delta), \\ 3, & \alpha = \beta = \chi = \delta. \end{cases}$$

The coefficients can be reset to their initialization value provided that a signal rst is set.

It is preferable to provide 4 modes for initializing the filter coefficients. The first 3 are internal. The predetermined initialization coefficients of these 3 internal modes may preferably read as follows:

$(b_0(0),b_1(0),\ldots,b_{14}(0))=\{0,0,0,0,0,0,0,16,0,0,$
$\quad 0,0,0,0,0\}$ (internal mode 0), $\{16,0,0,0,0,0,0,0,0,0,0,0,0,0,0\}$ (internal mode 1), or $\{0,0,0,0,0,0,0,0,0,0,0,0,0,0,16\}$ (internal mode 2).

The fourth mode is provided for external initialization coefficients which are loaded, by means of an I2C bus, into the 8 coefficient bits of each tap register REG21.

Figure 3:
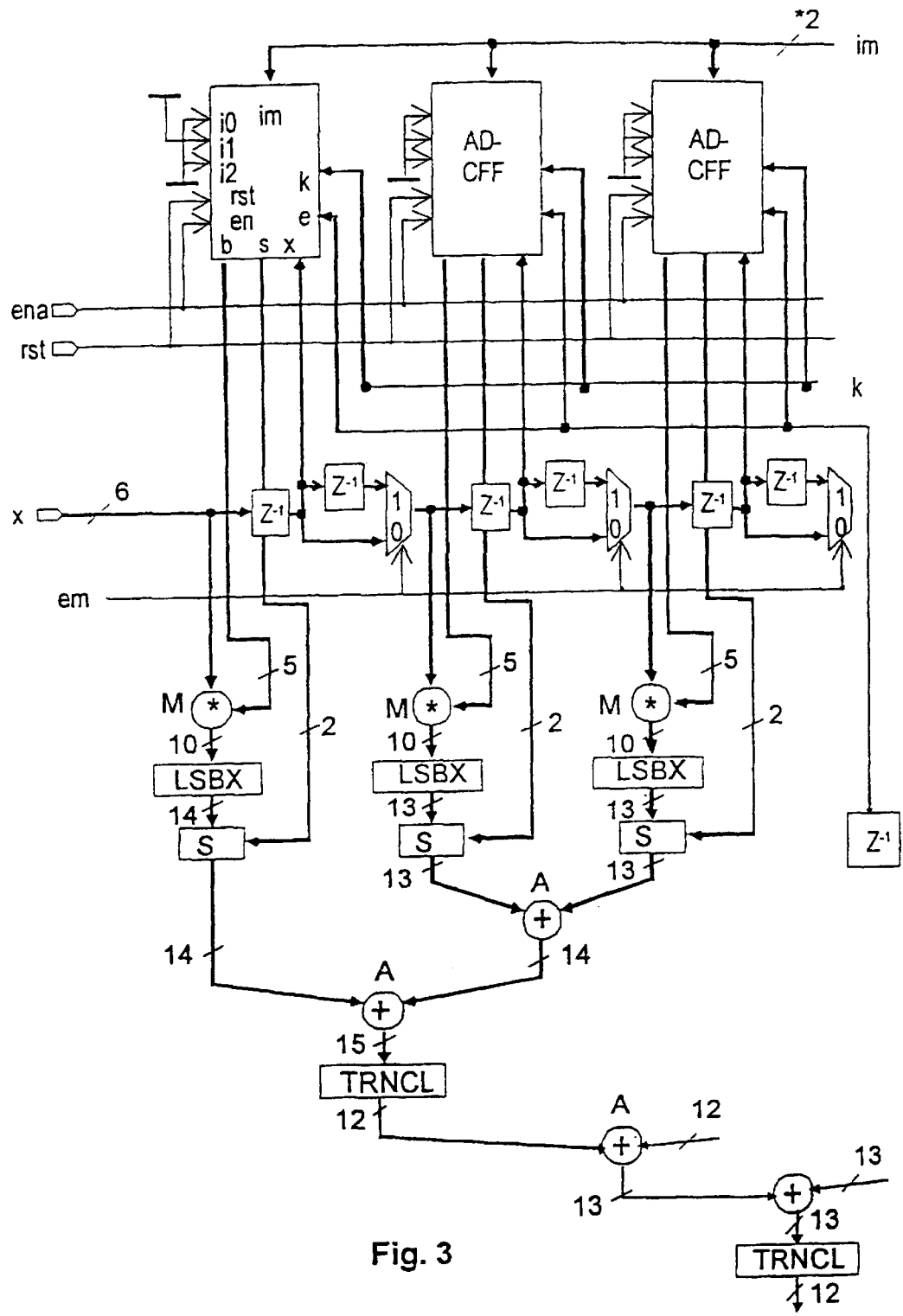
FIG. 3 shows a detail of the adaptive filter.

FIG. 3 shows a detail of the adaptive filter with the illustration of blocks for the coefficient adaptation AD-CFF. The input x is passed, on the one hand, via a delay stage $Z^{-1}$ to the x input of the first block AD-CFF and then further to the x input of the next block AD-CFF via a respective network comprising a delay stage $Z^{-1}$, a multiplexer and a further delay stage. A total of 15 blocks AD-CFF are used in this exemplary embodiment. The input x is initially connected to a multiplier M and is then subsequently connected to further multipliers M in each case after the multiplexer of each network. The multiplexers of the networks are jointly connected to the input em by their control input. Each b output of the 15 blocks AD-CFF is connected to the respective second input of the assigned multipliers M. The output of each multiplier M leads to a respective downstream LSB extension device LSBX, whose outputs each pass to an assigned shift register S which are connected in each case via a delay stage $Z^{-1}$ to the assigned s input of the blocks AD-CFF.

Addition means A combine the outputs of the LSB extension device LSBX. Outputs of in each case 3 or 4 adders A pass via respective devices TRNCL for clipping less signigicant bits to downstream adders A, until all of the lines end in a final adder A. Connected to this final adder A, via a device TRNCL for clipping less signigicant bits, is a limiter L1 which limits the signal in the range −16/15. The output signal of the limiter L1 passes, on the one hand, to the output y of the adaptive filter and also via an adder to whose second input a constant −8/8 is applied, which constant is determined by the sign of the output signal of the limiter L1. The output of the adder passes to the e input of the blocks AD-CFF via a range decision circuit BE1, a 0 value detector, and a delay element.

FIG. 4 shows the window moving in a tap register. Proceeding from the significance of the output signal of the device TRNCL1 for clipping less signigicant bits, the logic circuit L21 defines those bits which are forwarded to the output b by the downstream device TRNCL2 for clipping less signigicant bits. The device TRNCL2 clips the last 3 bits of the signal. If, by way of example, a large value is present, the latter is not shifted by the shift register S21. However, if a small value is present, it is shifted by up to 3 places, with the result that leading zeros are suppressed. The information about this shift operation is made available to the downstream circuit at the output s, in order to re-establish a correct position of the result after the calculation has been carried out.

What is claimed is:

1. Method for calculating a least mean square algorithm, which yields output samples comprising the steps of:

summing the products of preceding input samples with adapted filter coefficients, wherein, for the adaptation of the filter coefficients a first bit width is used and for the multiplication a second bit width is used, reducing the second bit width compared to the first bit width by selecting only a smaller number of bits as filter coefficients;

reducing the second bit width by evaluating the leading bits; and performing a windowing depending on the value of the leading bits.

2. Method according to claim 1, wherein filtering is carried out according to the equation:

$$y(n) = \sum_{i=0}^{N-1} bj(n) * x(n-i),$$

where n is the cycle index,

N is the number of taps, x(n) is the input value, y(n) is the output value, $b_i(n) = b_i(n-1) + e(n-1)*x(n-i-1)*2^{-k-11}$, $i=0,1,2,\ldots,14$, are the filter coefficients, with $e(n) := \{SIGN(32 - y(n)), y(n) \geq 0$ $\{SIGN(-32 - y(n)), y(n) < 0$ and $SIGN(\xi) := \{-1, \xi < 0$
$\{0\ \xi = 0,$
$\{1\ \xi > 0$ 3. Method according to claim 1, wherein filtering is carried out according to the equation:

$$y(n) = \sum_{i=0}^{N-1} bi(n) * x(n-2*i),$$

where n is the cycle index,

N is the number of taps, x(n) is the input value, y(n) is the output value, $b_i(n) = b_i(n-1) + e(n-1)*x(n-i-1)*2^{-k-11}$, $i=0,1,2,\ldots,14$, are the filter coefficients, with $e(n) := \{SIGN(32 - y(n)), y(n) \geq 0$ $\{SIGN(-32 - y(n)), y(n) < 0$ and $SIGN(\xi) := \{-1, \xi < 0$
$\{0\ \xi = 0,$
$\{1\ \xi > 0$ 4. Method according to claim 1, wherein said step of evaluating the leading bits is performed in a logic circuit, and said step of windowing is performed such that of the 8 most significant bits, 5 successive bits are selected, which preferably begin with a "1 0" or "0 1" bit combination, or, if such a combination is not present in the five most significant bits, the 5 least significant bits are selected.

5. Method according to claim 4, further comprising the the steps of:

multiplying a third value by an input value (x), whose bit length is preferably reduced;

subsequently carrying out an LSB extension;

shifting a result by a shift register as a function of the evaluation of the logic circuit; and limiting the results of N taps by means of adders with downstream LSB clipping and taken as an output signal of the filter.

* * * * *